(12) United States Patent
Yamaguchi et al.

(10) Patent No.: US 6,648,216 B2
(45) Date of Patent: Nov. 18, 2003

(54) PROCESS AND APPARATUS FOR FLOW SOLDERING

(75) Inventors: Atsushi Yamaguchi, Minoo (JP); Masato Hirano, Toyonaka (JP); Yoshinori Sakai, Sasayama (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/924,555

(22) Filed: Aug. 9, 2001

(65) Prior Publication Data

US 2002/0038815 A1 Apr. 4, 2002

(30) Foreign Application Priority Data

Aug. 21, 2000 (JP) .......................... 2000-249588

(51) Int. Cl.[7] .............................................. B23K 31/02
(52) U.S. Cl. ...................................... 228/260; 228/200
(58) Field of Search ........................... 228/37, 42, 46, 228/180.1, 232, 219, 260, 180.21, 259, 9, 200; 361/760, 773

(56) References Cited

U.S. PATENT DOCUMENTS

| | | |
|---|---|---|
| 3,056,015 A | 9/1962 | Lovelace |
| 4,402,448 A | 9/1983 | O'Rourke |
| 4,818,823 A * | 4/1989 | Bradley ...................... 174/259 |
| 5,236,117 A * | 8/1993 | Roane et al. .......... 228/180.21 |
| 5,685,475 A * | 11/1997 | Jairazbhoy et al. ............ 228/37 |
| 5,730,932 A * | 3/1998 | Sarkhel et al. ............... 420/562 |
| 6,416,883 B1 * | 7/2002 | Walton ........................ 428/647 |
| 6,575,352 B2 * | 6/2003 | Takahashi et al. ........... 228/223 |

FOREIGN PATENT DOCUMENTS

| | | |
|---|---|---|
| EP | 0 787 559 | 8/1997 |
| EP | 1 033 197 | 9/2000 |

OTHER PUBLICATIONS

Patent Abstracts of Japan, by Shusuke Tanaka, entitled "Soldering Method and Soldering Device", vol. 2000, No. 16, May 8, 2001.
Patent Abstracts of Japan, by Hideki Nakamura, entitled "Automatic Soldering Device", vol. 2000, No. 10, Nov. 17, 2000.
Patent Abstracts of Japan, by Hiroshi Yamaguchi, entitled "Manufacturing of Electronic Circuit Board", vol. 2000, No. 3, Mar. 30, 2000.

* cited by examiner

Primary Examiner—Tom Dunn
Assistant Examiner—Jonathan Johnson
(74) Attorney, Agent, or Firm—Wenderoth, Lind & Ponack, L.L.P.

(57) ABSTRACT

A flow soldering process for mounting an electronic component onto a board by means of a lead-free solder material. Molten solder material is supplied and attached to a predetermined portion of the board in a solder material supplying zone, and the board is thereafter cooled by a cooling unit in a cooling zone such that the solder material adhering to the board is rapidly cooled to solidify.

7 Claims, 4 Drawing Sheets

(a)

(b)

PROCESS AND APPARATUS FOR FLOW SOLDERING

CROSS-REFERENCE TO RELATED APPLICATIONS

The present application claims priority under 35 U.S.C. §119 to Japanese Patent Application No. 2000-249588 filed on Aug. 21, 2000, entitled "PROCESS AND APPARATUS FOR FLOW SOLDERING". The contents of that application are incorporated herein by reference thereto in their entirety.

BACKGROUND OF THE INVENTION

1. Field of the Invention

The present invention relates to a process and an apparatus for "flow soldering" (which is also referred to as "wave soldering") wherein electronic components are mounted onto (or bonded to) a board (or a substrate) by means of a lead-free solder material.

2. Description of Related Art

In recent years, it has been strongly desired to increase the reliability of an electronic circuit board which is contained in a downsized electronic device while still maintaining and a high performance of the electronic device. Therefore, there is an increasing demand to increase a reliability property such as the thermal shock resistance and the mechanical strength of a connecting portion which is formed by soldering an electronic component onto a board in the field of mounting the electronic components.

Moreover, while concern about the protection of global environment is increased in a worldwide scale, a regulation or legal system to control industrial waste treatments is being arranged. Although an Sn-Pb based solder material, which contains Sn and Pb as its main components (e.g. a so-called "63 Sn-37 Pb" eutectic solder material), is generally used in an electronic circuit board which is incorporated in an electronic device, lead contained in such solder material may cause environment pollution if it is subjected to an inadequate waste treatment. As a result, research and developments are carried out as to a solder material which does not contain lead (i.e. a so-called lead-free solder material) as an alternative to a solder material which does contain lead.

A conventional flow soldering process for producing an electronic circuit board by connecting a electronic components to a board such as a printed board as well as an apparatus for such process will be described with reference to drawings below. FIG. 3 shows a schematic view of the conventional flow soldering apparatus.

At first, a board is prepared prior to soldering, wherein through holes are formed through the board, and an electronic component is located thereon by inserting a lead (e.g. an electrode) of the component into the through hole from an upper surface of the board. In such a board, a land which is made of copper or the like is formed on a region (A+B+C, see FIG. 4) consisting of a surface (A) which defines the through holes as well as an upper surface portion (B) and a lower surface portion (C) of the board, where portions (B) and (C) surround the through hole, and such a land is connected to a circuit pattern on the upper surface of the board. On the other hand, regions of the upper surface and the lower surface of the board, except for the lands, are covered by a solder resist.

Next, the board is subjected to a pre-treatment in which the lower surface of the board on which no electronic component is located thereon is applied with flux by means of a spray fluxer (not shown). The pre-treatment is conducted in order to improve wetting and spreading of the solder material on a surface of the land by removing an oxide film (such as a film formed by natural oxidation) which is inevitably formed on the land.

Then, referring to FIG. 3, a thus prepared board (not shown) is put into the flow soldering apparatus 60 while the upper surface on which the electronic component is located is kept upward (with regard to the drawing), and the board is mechanically transferred in a direction of the arrow 61 inside the flow soldering apparatus 60 with a substantially constant velocity by means of a conveyer. In the flow soldering apparatus 60, the board is first heated in a pre-heating zone by means of a preheating unit (or preheater) 62 in order to make the flux applied to the board, according to the pre-treatment, effectively display its activity ability.

Thereafter, when the board is conveyed into a solder material supplying zone located above solder wave nozzles 64 and 65, the solder material (not shown), which is in a molten state by heating beforehand in a solder material supplying unit 63, is supplied to the board from its lower side through the primary wave nozzle 64 and the secondary wave nozzle 65 in the form of a primary wave and a secondary wave respectively. The solder material thus supplied goes up from the lower surface of the board by means of the capillary action through an annular space between the surface of the through hole (i.e. the land) and the lead which is inserted through the through hole from the upper surface of the board. Thereafter, the solder material naturally cools by releasing its heat to surrounding areas of the board with its natural cooling rate, so that the solder material thereby solidifies to form a connecting portion of the solder material (or a so-called "fillet"). In this step of supplying the solder material (or the step of flow soldering), the primary wave functions so as to sufficiently wet the surfaces of the lead and the land with the solder material, and the secondary wave functions so as to remove the solder material on regions covered with a solder resist. As a result, the solder material does not form a bridge by remaining on the board and thereby solidifying between the lands (the bridge is not desirable because it causes a short circuit), and the solder material does not form a cornute projection, thereby controlling (or conditioning) the form of the fillet.

As described above, the fillet (or the connecting portion) made of the solder material is formed to electrically and physically (or mechanically) connect the lead of the electronic component and the land formed in the board. p The fillet made of the solder material as described above is required to have a sufficiently large connecting strength between the lead of the electronic component and the land of the board in order to provide a high reliability of the electronic circuit board. However, referring to FIG. 4, if the electronic circuit board 70 is produced by using the lead-free solder material according to the conventional flow soldering process as described above, the solder material having been wetted and spread on the surface of the land 73 (which is located to cover an inside surface which defines the through hole 72 perforated through the board 71 as well as regions which surround the through hole 72 on the upper side and the lower side of the board 71) partially peels off at an interface between the solder material and the land as indicated by the arrow 80 upon the solidification of the solder material. There thus arises a problem in that the connection between the land 73 and the fillet 74 made of the solder material becomes insufficient and thereby a high connecting strength between the lead 75 and the land 73 cannot be obtained.

Such a phenomenon of the peeling-off of the fillet 74 from the land 73 is generally referred to as a "lift-off" phenomenon, which frequently occurs when the lead-free solder material is used, although it scarcely occurs when the Sn-Pb based solder material is used. The lift-off phenomenon notably occurs especially in the cases where the lead-free solder material which contains Sn and Bi (such as an Sn-Ag-Bi based material) is used and in the cases where the lead-free solder material for connecting a lead which is plated with an Sn-Pb based material is used.

As a reason for the occurrence of the lift-off, it could be generally considered that the solder material used for the flow soldering and/or a metal material which can elute into the solder material upon soldering (e.g. a plating metal for the lead) forms a weak alloy having a lower melting point than that of the initial solder material and a composition which is different from that of the initial solder material (hereinafter, such an alloy is merely referred to as a "low-m.p. alloy") upon the solidification of the solder material from its molten state.

When the molten solder material is at a high temperature it loses its heat mainly via the lead 75 which comes from the electronic component (not shown). In the solder material (the fillet) 74 which is supplied and which adheres to the board 71, a temperature gradient is formed by a flux of such heat passing through the lead 75. The solidification of the solder material 74 progresses according to its temperature gradient, wherein the lowest temperature portion of the solder material 74 is formed at the top of the solder material 74, which is indicated by the arrow 81, and the highest temperature portion is formed in the vicinity of the interface between the fillet 74 and the land 73, which is a good heat conductor. As a result, the solidification begins at the top of the solder material 74 and ends at the interface between the land 73 and the fillet 74 in due course. Upon solidification, and low-m.p. alloy as described above is distributed (or segregated) in a greater amount in a still molten portion of the solder material which has not yet solidified, such that the low-m.p. alloy is transferred to and concentrated (or segregated) in the molten portion in relation to the progress of the solidification. That is, a segregation phenomenon occurs upon solidification of the solder material, and as a result, the low-m.p. alloy 76 gathers at the interface between the land 73 and the fillet 74 which is where the solidification occurs last. In accordance with this manner of solidification, the fillet 74 solidifies at the top first and attaches to the lead 75. As a result, a tension is generated in the direction of the arrow 82 by a contraction due to the solidification of the solder material, and a tension in the direction of the arrow 83 is generated by the thermal contraction of the board 71. It could be considered that the weak low-m.p. alloy 76 which is enriched in the vicinity of the interface between the land 73 and the fillet 74 as described above can not endure these tensions, and as a result, the peel-off phenomenon is caused at the interface as shown in the direction of the arrow 80.

SUMMARY OF THE INVENTION

The present invention has been made to solve the problems described above and to further improve the conventional technique as described above. Accordingly, the present invention aims to provide a flow soldering process for mounting (or bonding) electronic components onto a board by means of a lead-free solder material so as to effectively reduce the occurrence of the lift-off phenomenon, and also provide an apparatus for conducting such a process.

According to one aspect of the present invention, there is provided a process for mounting electronic components onto a board by means of a lead-free solder material (which is also simply referred to as the solder material). The process comprises supplying a melt of the solder material in a solder material supplying zone such that the solder material adheres to a predetermined portion of the board, and thereafter cooling the board by a cooling unit in a cooling zone such that the solder material adhering to the board is quickly cooled (or quenched) so as to be solidified.

In particular, it is sufficient that the cooling of the board (and thus the rapid cooling of the solder material) in the cooling zone of the present invention is carried out by positively (or forcedly) cooling the board by means of the cooling unit for at least a period between a time at which the solder material in the molten condition has just been at its melting point temperature and a time at which all of the solder material (or a connecting portion of the solder material) has just completed its solidification. As far as such cooling is ensured, any appropriate cooling unit may be used for an appropriate time including the above period. Further, the cooling of the board in the cooling zone may be carried out in any appropriate manner as far as the solder material which is adhering to the board is rapidly cooled by cooling the board positively (or forcedly) by means of the cooling unit. For example, the whole board may be cooled, or at least a part of the board (i.e. only a necessary part) may be cooled.

According to the present invention as described-above, the lead-free solder adhering to the board is quickly cooled (or quenched) by positively cooling the board using the cooling unit, so that a period from the start of the solidification of the solder material to the end of the solidification (i.e. the complete solidification) is thereby shortened. In the conventional process, the segregation phenomenon occurs in the solder material by the temperature gradient within the inside of the solder material (or the fillet) since the board is not positively cooled, and as a result, the weak low-m.p. alloy finally gathers in the vicinity of the interface between the fillet and the land as described above. On the other hand, in the present invention, the solder completely solidifies in a shorter period as compared with the conventional process. Accordingly, the segregation phenomenon can be alleviated, and in particular, the gathering of the low-m.p. alloy in the vicinity of the interface is avoidable so that the occurrence of the lift-off phenomenon is thereby suppressed.

Furthermore, in the conventional process, a metal phase which is hard and brittle (such as a Bi phase or a Bi mass) is formed in the fillet upon the solidification of the solder material and thereby provides brittleness to the fillet, and as a result, the fillet has a low mechanical strength. According to the present invention, on the other hand, the period required for the solidification of the solder material is shortened, and thus, the period during which such a metal phase grows is shortened, which makes a structure of the metal phase in the fillet minute (or fine). As a result, the mechanical strength of the fillet is increased by the present invention.

In a preferred embodiment, the lead-free solder material is cooled in the cooling zone at a cooling rate of at least 200° C./min. The cooling rate is preferably as large as possible, and the cooling rate is, for example, in a range of about 200 to 500° C./min, and preferably about 300 to 500° C./min.

It is noted that the cooling rate is referred to as a temperature decreasing rate corresponding to decreasing the temperature of a solder material portion (and in particular, a portion to be a connecting portion (or fillet portion) made of the solder material by solidification of the solder material), and it is inherently an average temperature decreasing rate over a period between a time at which the solder material in the molten condition has just been at its melting point temperature and a time at which the solder material (or the whole solder material portion) has just completed solidifying. However, there is practically no problem when such an average temperature descreasing rate is regarded as an average of a measured temperature of the solder material portion at a moment when the board arrives into the cooling zone and a measured temperature of the solder material portion at a moment when the board departs out of the cooling zone, and thus, such an average of the measured temperatures is conveniently used as the average temperature decreasing rate (i.e. the cooling rate) in the present specification. The temperature of the solder material portion (i.e. the connecting portion of the solder material) can be measured by a thermocouple placed on (for example, attached to) a predetermined portion of the board on which the solder material is to adhere (for example, a land located on one side of the board to which the solder material is supplied), and data from the thermocouple can be recorded together with time.

The positive cooling of the board in the cooling zone as described above can be carried out by gas cooling or by liquid cooling, and as the cooling unit for cooling the board, a unit which employs the gas cooling or the liquid cooling can be used. It is noted that gas cooling means the operation of cooling the board by using a gas (such as air (or ambient air), or an inert gas such as nitrogen gas) as a coolant whose temperature is lower than the temperature of the board (and, in particular, lower than the temperature of the solder material which is adhering to the board), and is generally considerably lower than such temperature. The gas cooling allows the board to be in contact with such gas so as to cool the board. For example, such gas has a temperature in the range between −20 and 30° C., and preferably in the range between −10 and 10° C. The gas cooling can be carried out by passing the board through an atmosphere including such gas or by blowing such gas directly toward the board. Also, liquid cooling means the operation of cooling the board by using a liquid (such as water, liquefied nitrogen or other liquid) as a coolant whose temperature is lower than a temperature of the board (and, in particular, the temperature of the solder material which is adhering to the board), and is generally considerably lower than such temperature. The liquid cooling allows at least a necessary portion or the whole board to be in contact with such liquid so as to cool the board. For example, such liquid has a temperature in the range between 1 and 30° C., and preferably in the range between 1 and 10° C. The liquid cooling can be carried out by dipping the board into an amount of the liquid or by spraying the liquid toward the board. The liquid cooling can use a latent heat of vaporization of the liquid, which is advantageous for the readily rapid cooling.

Concretely, as the cooling unit using the gas cooling, a unit may be used which comprises a blower or a gas flowing device (including, for example, a pump) which supplies the low temperature gas into the cooling zone, and then discharges the gas from the cooling zone. Such supplied gas forms a low temperature atmosphere through which the board is passed. Further, a unit comprising at least one nozzle, a fan, a spot cooler or the like which blows the low temperature gas directly toward the board may also be used. As the cooling unit using the liquid cooling, a unit may be used which comprises either a bath containing the liquid into which the board is dipped so as to cool an entire portion of the board, an atomizer which forms and sprays a mist of the liquid toward at least a portion of the board, a nozzle which supplies a relatively small amount of the liquid to at least a portion if the board or the like. Depending on the kind of such cooling unit, it may be located in the cooling chamber, or the unit may be connected to the cooling chamber so that a portion or the whole unit thereof is located outside the cooling chamber. It is of course possible to employ any combination of the above-mentioned various kinds of the cooling units. In order to obtain a larger cooling rate, it is preferable that the liquid cooling rather than the gas cooling is employed for the purpose of the positive cooling.

In the case of the gas cooling, the cooling rate can be obtained as desired by controlling the temperature of the gas which is supplied to the cooling zone and the flow rate of such gas, a transfer speed of the board and so on while considering the heat capacities of the board and the components which are located on the board. In the case of liquid cooling, a desired cooling temperature can be obtained by controlling a temperature of the liquid which is contacted with the board, the transfer speed of the board, and so on while considering the heat capacities of the board and the components which are located on the board. For instance, a cooling rate of about 210° C./min. is obtained by passing a board made of a glass epoxy resin having a size of 200 mm×200 mm×0.8 mm at a speed of about 1.2 m/min, through a chamber having a size of 1000 mm×500 mm×500 mm while blowing a gaseous atmosphere having a temperature of about 25° C. towards the board at a flow rate of about 2 liter/min.

The positive cooling of the board in the cooling zone is preferably conducted by the gas cooling in which the cooling unit uses nitrogen gas. In such a case of gas cooling using nitrogen gas, oxidation of the solder material can be prevented so that a wetting property of the solder material (and especially the wetting property with respect to the land) is improved, which thereby further decreases the occurrence of the lift-off.

In another preferred embodiment, the process of the present invention further comprises, after supplying the molten solder material to the board in the solder supplying zone so as to adhere to the predetermined portion of the board and before cooling the board in the cooling zone, locating the board in a conditioning zone having an atmosphere at a temperature which ensures a complete molten state of the solder material adhering to the board. It is sufficient that the complete molten state of the solder material is ensured at least at a time just before the board is cooled in the cooling zone. It is readily understood by those skilled in the art that such a conditioning zone is located downstream of the solder material supplying zone and upstream of the cooling zone with respect to the transfer direction of the board.

The conditioning zone functions to condition the board after the solder material is attached to the board and before the board is rapidly cooled. In particular, it conditions the board (particularly the solder material adhering to the board) such that the solder material at any position of the board is substantially entirely in the molten state (that is, the entire solder material is substantially and homogeneously in the molten state over an entire portion of the board to which the solder material is to be adhered thereto). Concretely, when the board comes into the conditioning zone while a portion of the solder material which is adhering to the board is naturally cooled and begins its solidification, the board (and thus the solder material) is heated in the conditioning zone so that the entire portion of the solder material which is naturally solidifying is again melted preferably completely before the board is cooled in the cooling zone. When the board comes into the conditioning zone while the entire portion of the solder material which is adhering to the board is substantially in the molten condition, the board is located in an atmosphere of the conditioning zone in which the board (and thus the solder material) does not lose an amount of heat excessively (preferably be being supplied with heat) so that the solder material does not start its solidification at least before the board goes into the cooling zone, and thus, the molten state of all of the solder material can be kept. Thus, in this case, no positive heating of the board is necessarily carried out. The conditioning zone may be referred to as a heating zone which heats the board by supplying an amount of the heat to the board so as to raise the temperature of the solder material, or as a constant temperature zone which is kept at a certain temperature and in which an excessive temperature drop (and thus excessive cooling) of the solder material (thus the board) is suppressed during when the board passes through the conditioning zone (or until it comes into the cooling zone) by supplying a lesser amount of heat or by thermally insulating the conditioning chamber.

The provision of the board in the conditioning zone as described above can reduce a temperature difference (or narrow a temperature distribution) within the solder material of each connecting portion as well as a temperature difference within connecting portions of the solder material over the board as a whole. In other words, the conditioning zone functions to make the board and thus the solder material in a thermally uniform condition. In the absence of the conditioning zone, the solder material may begin to partly solidify before the board is cooled in the cooling zone, and in such a case, an initial temperature upon which rapid cooling begins in the cooling zone may vary between a single connecting portion of the soldering material or throughout all of the connecting portions to some extend. On the other hand, when the board is conditioned to be thermally uniform beforehand by providing such a conditioning zone upstream of the cooling zone, any such variation of the initial temperature upon which rapid cooling begins, which thereby results in a variation of the period required for the solidification of the solder material, can be suppressed. As a result, it is possible to further decrease the occurrence ratio of the lift-off.

The temperature of the atmosphere of the conditioning zone as described above can be any temperature as long as it both ensures the molten condition of the solder material before the board goes into the cooling zone and it is less than a heat resistant temperature of the electronic component mounted on the board so as to avoid thermal damage of the electronic component. The temperature of the conditioning zone is preferably in the range which is not less than the melting point of the solder material and which is less than the heat resistant temperature of the electronic component in order to completely or entirely melt the solder material. More preferably, the temperature of the conditioning zone is within the range which is higher than the melting point of the solder material by 10° C. and lower than the heat resistant temperature of the electronic component by 5° C. However, the present invention is not limited to the above. For example, where the solder material which is adhering to the board is at a higher temperature than the melting point of the solder material (i.e. the solder material has not started its solidification) when the board comes into the conditioning zone and the conditioning zone can prevent such excessive temperature decreases of the solder material therein such that the solder material starts to solidify when the board passes through the conditioning zone, the temperature of the conditioning zone is not necessarily higher than the melting point of the solder material. It is of course preferable even in such a case that the temperature of the conditioning zone is not lower than the melting point of the solder material and lower than the heat resistant temperature of the electronic component from a viewpoint of the complete molten condition of the solder material.

It is preferable that the atmosphere of the conditioning zone consists essentially of nitrogen gas. As a result, the oxidation of the solder material and the land is prevented to avoid degradation of the wetting property of the solder material, and as a result, a connecting area of the land with the solder material is sufficiently ensured to suppress the peel-off of the solder material.

The atmospheres of the conditioning zone and the cooling zone can be selected independently of each other, although both of them are preferably of nitrogen gas.

According to another aspect of the present invention, there is provided an apparatus for mounting (or bonding) electronic components onto a board by a flow soldering process using a lead-free solder material (which is also referred to as merely "solder material" as described above). The apparatus comprises a solder material supplying unit (or a solder material supplier) which supplies a molten solder material located in a solder material supplying chamber so as to attach molten solder material to a predetermined portion of a board, located downstream of the solder material supplying chamber, wherein the board is cooled by a cooling unit (or a cooler) so as to rapidly cool and solidify the solder material which is adhering to the board.

In a preferred embodiment of the above-described apparatus, the board is cooled by the cooling unit in the cooling chamber such that the lead-free solder material is rapidly cooled at a cooling rate which is not less than 200° C./min. As the cooling unit, a unit may be used which uses the gas cooling or the liquid cooling, and preferably the gas cooling uses nitrogen gas as the cooling gas as explained above with reference to the flow soldering process according to the present invention.

In another preferred embodiment of the above-described apparatus, the apparatus of the present invention further comprises a conditioning chamber located between the solder material supplying chamber and the cooling chamber with respect to the transfer direction of the board. An atmosphere in the conditioning chamber has a temperature at which the solder material is ensured to be in a completely molten condition. The temperature of such an atmosphere in the conditioning chamber is preferably not lower than the melting point of the solder material and lower than the heat resistant temperature of the electronic component. Further, the conditioning chamber preferably contains a nitrogen gas atmosphere.

It is noted that the term "chamber" is intended to mean a structural member which defines a space, the term "zone" is intended to mean a space (or a spatial member) within the chamber, and the term "atmosphere" is intended to mean a gaseous atmosphere (or a gas) in the space formed by the chamber (thus, an atmosphere in a zone is substantially the same as an atmosphere in a chamber). For example, the "solder material supplying chamber" defines the "solder supplying zone" of the flow soldering process according to the present invention, and this is similarly applicable to the "cooling chamber" and the "conditioning chamber".

The flow soldering process according to the present invention as described above is conveniently carried out using the apparatus according to the present invention.

Therefore, it is understood by those skilled in the art that the above descriptions as to the solder material supplying zone and the cooling zone as well as the optional conditioning zone with reference to the preferred embodiments of the process according to the present invention are also applicable to the solder material supplying chamber and the cooling chamber as well as the optional conditioning chamber.

In the flow soldering apparatus according to the present invention, the solder material supplying chamber does not have to be formed such that the solder material supplying zone is definitely divided from other spaces in the apparatus. The cooling chamber may definitely divide the solder material supplying zone from other spaces having relatively high temperatures at least to such an extent that the positive cooling of the board is effectively carried out in the apparatus of the present invention. Also, the conditioning chamber may be such that its atmosphere is definitely divided from other atmospheres having relatively high temperatures (such as an atmosphere of the solder material supplying chamber), but not necessarily definitely divided from other spaces in the apparatus. However, the conditioning chamber and the cooling chamber are preferably structured such that atmospheres of these chambers are divided from each other to some extent from a viewpoint of the thermal efficiency.

It should be noted that the solder material supplying chamber, the cooling chamber and the optional conditioning chamber which are described above with reference to the flow soldering apparatus according to the present invention do not necessarily have to be used upon conducting the flow soldering process according to the present invention, and other apparatus may be used so long as it allows the rapid cooling as described above.

The lead-free solder material which can be used for the flow soldering process and/or the flow soldering apparatus according to the present invention includes, for example, an Sn-Cu based material, an Sn-Ag-Cu based material, an Sn-Ag based material, and Sn-Ag-Bi based material, an Sn-Ag-Bi-Cu based material or the like. With regarding to the board, a board made of, for example, a paper phenol, a glass epoxy resin, a polyamide film, a ceramic or the like can be used. The electronic component connected to the board can be any electronic component which is connected to the board by means of the through hole formed through the board. For example, the electric components can be a DIP IC (Dual In-line Package-Integrated Circuit), a connector and an axial lead component. However, these are described only for illustrative purposes, and the present invention is not limited thereto.

BRIEF DESCRIPTION OF THE DRAWINGS

More sufficient appreciation of the invention and many of the attendant advantages thereof will readily become apparent with reference to the following detailed description, particularly when considered in conjunction with the accompanying drawings, in which.

Figure 1:
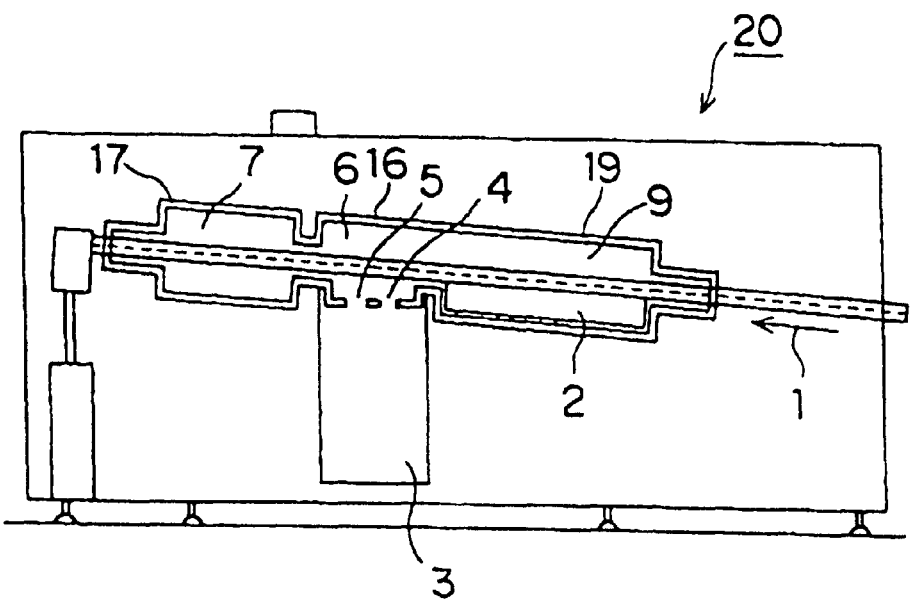
FIG. 1(a) shows a schematic view of a flow soldering apparatus in one embodiment of the present invention.
FIG. 1(b) shows a schematic partial view of a flow soldering apparatus of FIG. 1(a) in which an inside of a cooling chamber is shown.
Figure 1:
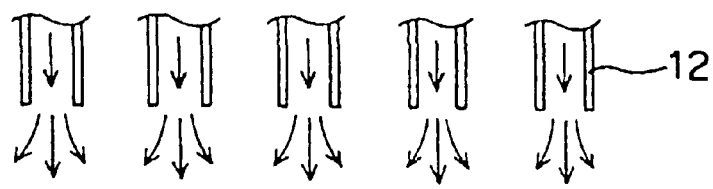
Figure 1:
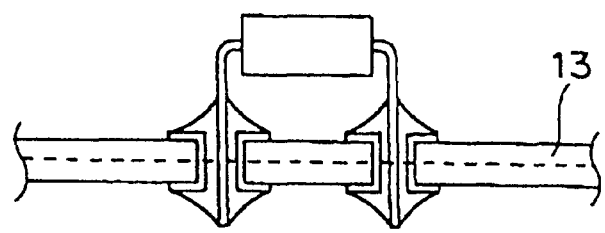
Figure 1:
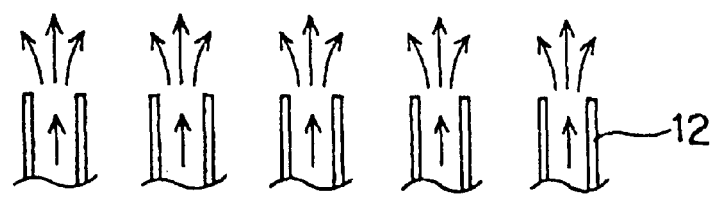

Numerals in the drawings denote the following elements:
1 . . . arrow (transfer direction of board)
2 . . . preheating unit;
3 . . . solder material supplying unit;
4 . . . primary wave nozzle;
5 . . . secondary wave nozzle;
6 . . . solder material supplying zone;
7 . . . cooling zone;
8 . . . conditioning zone;
9 . . . preheating zone;
12 . . . nozzle (a part of cooling unit);
13 . . . board;
16 . . . solder material supplying chamber;
17 . . . cooling chamber;
18 . . . conditioning chamber;
19 . . . preheating chamber; and
20 and 30 . . . flow soldering apparatus.

DETAILED DESCRIPTION OF THE INVENTION

Hereinafter, two embodiments of the present invention will be described in detail with reference to the drawings.

First Embodiment

A flow soldering process in the first embodiment of the present invention is conducted by using a flow soldering apparatus of the present invention as shown in FIG. 1(a).

Referring to FIG. 1(a), the flow soldering apparatus 20 of the present embodiment comprises a preheating unit (or a preheater) 2, a solder material supplying unit 3 which supplies a melt of the solder material to the board (not shown in FIG. 1(a), a preheating chamber 19, a solder material supplying chamber 16, and a cooling chamber 17 through which chambers 19, 16 and 17 the board is passed in a direction of the arrow 1. The solder material supplying unit 3 contains the solder material therein (not shown) which has been heated to melt beforehand (i.e. the molten solder material) and which supplies, to the board in the solder material supplying chamber 16 (and thus in the solder material supplying zone 6), the solder material in the form of waves by flowing the solder material through the primary wave nozzle 4 and the secondary wave nozzle 5. It is noted that each of the preheating chamber 19, the solder material supplying chamber 16 and the cooling chamber 17 has an inner space as the preheating zone 9, the solder material supplying zone 6 and the cooling zone 7, respectively, and there are generally provided passages between them so that the board can pass through these zone. As shown in the embodiment of FIG. 1(a), there may be no clear border between the preheating chamber 19 and the solder material supplying chamber 16, which will be explained below.

The preheating chamber 19 defines the preheating zone 9 in which the board is preheated. The preheating unit 2 is contained in the preheating chamber 19 in the shown embodiment, although the present invention is not limited to such embodiment. The preheating unit 2 may be outside the preheating chamber 19. The preheating unit is not necessarily required upon conducting the present invention, but it is preferable that the preheating unit 2 is provided. The solder material supplying chamber 16 is located above the solder material supplying unit 3 and defines the solder material supplying zone 6 in which the solder material in the molten state is supplied to the board through the solder wave nozzles 4 and 5. The preheating zone 9 and the solder material supplying zone 6 as described above preferably have high temperature atmospheres, respectively, so that they do not necessarily have to be formed as definitely separate from each other. Thus, the preheating chamber 19 and the solder material supplying chamber 16 (and thus the atmospheres therein) are not necessarily divided distinctly. In the shown embodiment, the preheating chamber 19 and the solder material supplying chamber 16 are connected without any partition, and thus the respective atmospheres therein are also connected. However, the present invention is not limited to such an embodiment. For example, the preheating chamber 19 and the solder material supplying chamber 16 may be formed such that the respective atmospheres therein are separated to some extent.

The cooling chamber 17 defines the cooling zone 7 which positively or forcedly cools the board by means of a cooling unit so as to rapidly cool and solidify the solder material which is adhering to the board. For such cooling, the cooling chamber 17 comprises the cooling unit (not shown) which can cool the board in the cooling zone 7, which is located in the inner space of the cooling chamber 17. The cooling unit may be contained in or connected to the cooling chamber 17. As the cooling unit, any appropriate device can be used as far as the solder material is rapidly cooled (or quenched). For example, a unit comprising at least one nozzle which ejects a gas as a coolant may be used. Concretely, referring to FIG. 1(b) which schematically shows and enlarged side view of the board 13 inside the cooling chamber 17, it is possible to use a unit which is provided with a plurality of nozzles 12 arranged above and below a transfer line (shown with the broken line) of the board 13 and which is structured such that the gas is ejected as shown by the arrows through the nozzles 12 from its source outside the cooling chamber 17 by means of a pump (or a blower) which is also outside the cooling chamber 17. The nozzles 12 preferably eject a low temperature gas toward the board 13 so that the board 13 is cooled by the gas cooling. The location of the nozzle 12 in the cooling chamber 17 is not particularly limited in their location so long as the material adhering to the board 13 passing through the chamber 17 is rapidly cooled in order to solidify the solder material entirely. The nozzles are not always provided on the both sides of the transfer line, and they may instead be provided only on one side. The cooling unit is not limited to having the nozzles as described above, and another cooling unit may be used which allows a gas or a liquid or any combination thereof to contact with the board so as to cool the board, whereby the solder material is rapidly cooled.

For example, the cooling unit which can be used for cooling the board may supply the low temperature gas into the cooling chamber 17 so that the temperature of the atmosphere of the cooling zone 7 is kept at a considerably low temperature (such as a temperature in the range between −20 and 30° C.), whereby the board (more particularly the solder material adhering to the board) is rapidly cooled. In this case, the low temperature gas may not have to be directed to the board.

It is sufficient from a viewpoint of the thermal efficiency that the solder material supplying chamber 16 and the cooling chamber 17 as described above define atmospheres therein at least to a degree that enough wetting up of the solder material on the through hole surface of the board and the cooling of the board are effectively provided in these chambers, respectively. It should be noted that the atmospheres in the solder material supplying chamber 16 and the cooling chamber 17 do not have to be necessarily divided distinctly.

Next, the flow soldering process according to the present invention using the flow soldering apparatus 20 in FIG. 1(a) will be described.

The board is first subjected to a pre-treatment by applying a flux to a lower surface of the board by means of a spray fluxer. Electronic component are located on the board beforehand with at lead one lead of the electronic component inserted through a through hole from an upper surface side of the board.

Such a board is put into the flow soldering apparatus 20 in FIG. 1(a) while the upper surface on which the electronic component are located is set upward (with reference to the drawing), and mechanically transferred through the preheating chamber 19, the solder material supplying chamber 16 and the cooling chamber 17 of the flow soldering apparatus 20 in a direction of the arrow 1 along the transfer line (shown with the broken line) with a substantially constant speed by means of a conveyer. In the flow soldering apparatus 20, the board is heated (or preheated) to about 150 to 160° C. by the preheating unit 2 in the preheating zone 9 whose atmosphere is of atmosphere air and preferably nitrogen gas. When the board is conveyed into the solder material supplying zone 6 in due course, the solder material (not shown), which has been previously heated and melted, is supplied from the underside of the board through the primary wave nozzle 4 and the secondary wave nozzle 5 to the board in the form of the primary and secondary waves, respectively, by means of the solder material supplying unit 3. As will be understood, such supply of the solder material is substantially the same as the aforementioned flow soldering process, which is described as the conventional process.

Following the attachment of the molten solder material to the predetermined portion of the board as described above, the board is located in the cooling zone 7 while being transferred into the cooling chamber 17 from the solder material supplying chamber 16. In the cooling zone 7, the board is rapidly cooled with nitrogen gas by blowing the nitrogen gas having a low temperature toward the board such that the solder material is rapidly cooled in order to solidify. The cooling rate of the solder material is preferably not less than 200° C./min, and it can be, for example, about 200 to 500° C./min and preferably about 300 to 500° C./min. It is noted that the board can be cooled by means of the other gas cooling (such as air cooling which blows low temperature air (atmospheric air) toward the board) or the liquid cooling operations (such as water cooling in which a circulated water having a low temperature contacts the board) while using any appropriate cooling units as described above.

As a result of the positive cooling of the board while using the cooling unit as described above, the solder material solidifies to form a fillet which electrically and physically connects the lead of the electronic component with the land formed on the board. The produced electronic circuit board is further transferred to the outside of the cooling chamber 17 so as to remove it from the apparatus 20. As described above, the electronic circuit board in which the electronic components have been soldered to the board can be produced.

According to the above embodiment and as described in the SUMMARY OF THE INVENTION, an occurrence of the lift-off phenomenon is effectively suppressed since the period for solidifying of the solder material is shortened. Furthermore, a mechanical strength of the connecting portion consisting of the solder material (i.e. the fillet) is increased since finer metal phases are formed in the solidified solder material (i.e. the fillet).

Second Embodiment

Figure 2:
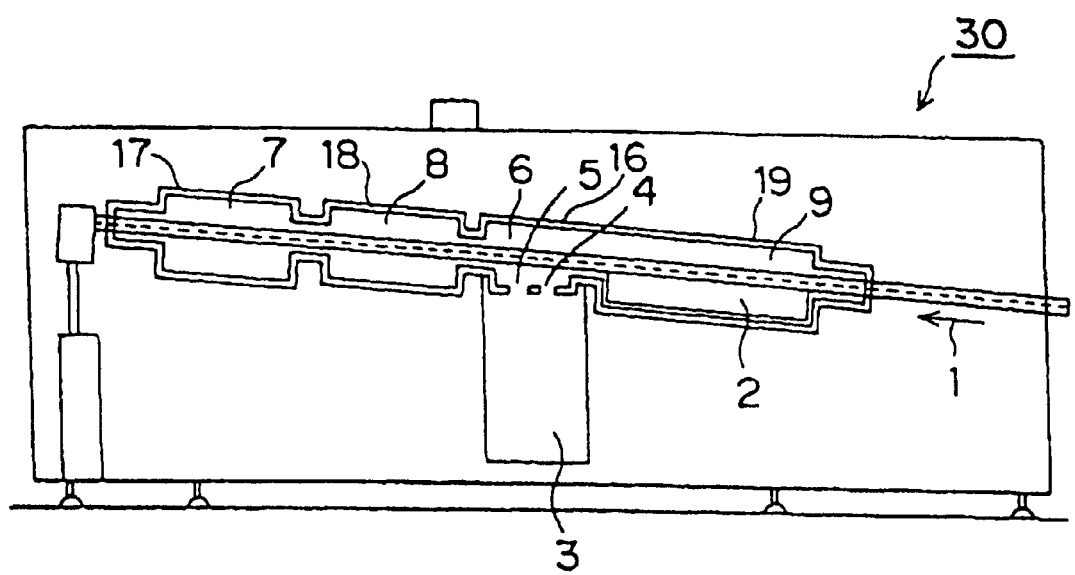
FIG. 2 shows a schematic view of a flow soldering apparatus in another embodiment of the present invention.
Figure 3:
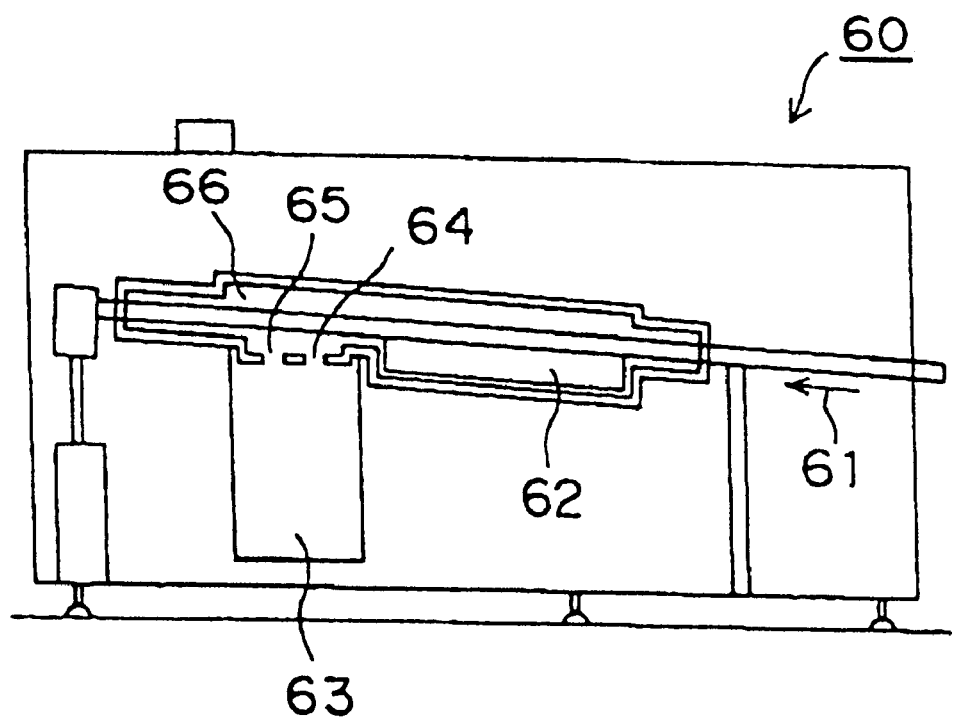
FIG. 3 shows a schematic view of a conventional flow soldering apparatus.
Figure 4:
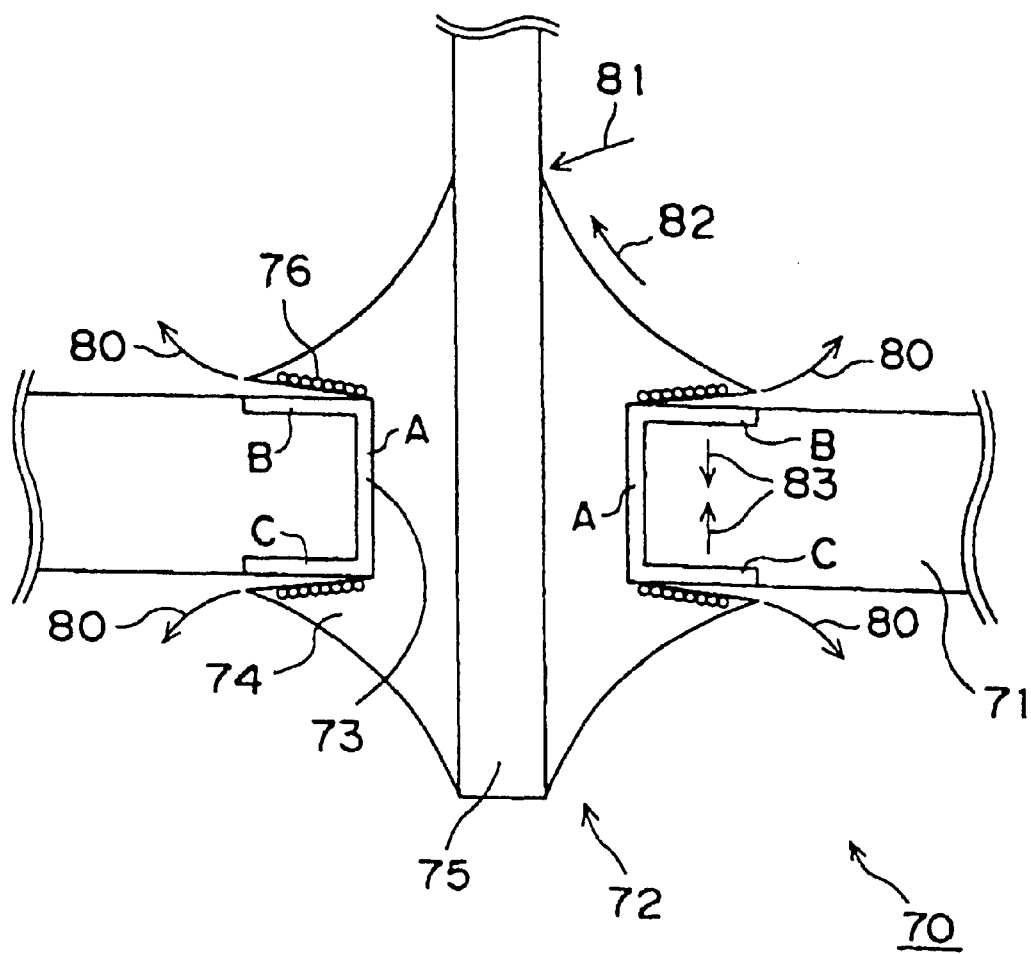
FIG. 4 shows a schematic cross-sectional view of a part of an electronic circuit board which is produced according to a conventional flow soldering process.

The second embodiment of the present invention will be hereafter described. A flow soldering process in this embodiment is conducted by using a flow soldering apparatus 30 according to the present invention as shown in FIG. 2. In the following description with respect to the second embodiment, the description which is substantially the same as that of the aforementioned first embodiment will be omitted.

The flow soldering apparatus 30 is similar to the flow soldering apparatus 20 shown in FIG. 1(*a*) described in connection with the first embodiment except that the flow soldering apparatus 20 in the first embodiment is modified to be provided with a conditioning chamber 18, which results in the second embodiment. The conditioning chamber 18 forms a conditioning zone 8. Similar to the solder material supplying chamber 16, it is sufficient from a viewpoint of thermal efficiency that the conditioning chamber 18 defines an atmosphere therein at least to such a degree that the board is effectively heated or, optionally, heat loss of the board is effectively prevented. It should be noted that the atmosphere of the conditioning chamber 16 is not necessarily completely separated from another atmosphere having a high temperature such as the atmosphere of the solder material supplying chamber 16. In the shown embodiment, the atmosphere of the conditioning chamber 18 is separated from that of the solder material supplying chamber 16 to some extent, but these two chambers are optionally integrated to form one chamber while taking the thermal efficiency into consideration.

In the flow soldering process using such a flow soldering apparatus 30, the board is located in the conditioning zone 8 by transferring it from the solder material supplying chamber 16 to the conditioning chamber 18 following the supply of the solder material to the board in the solder material supplying zone 6 similar to the first embodiment. The conditioning zone 8 has an atmosphere whose temperature is preferably not less than the melting point of the solder material and less than the heat resistant temperature of the electronic component, e.g. about 220 to 230° C., in order to thereby ensure that the solder material adhering to the board is in a completely molten condition. The atmosphere of the conditioning zone may be of air and is preferably of nitrogen gas.

Thereafter, the board is transferred from the conditioning chamber 18 into the cooling chamber 17 to be placed in the cooling zone 7 where is cooled as described in the first embodiment. As a result, the solder material solidifies to form the fillet so that the lead of the electronic component and the land formed on the board are electrically and physically connected by the fillet. Thus, the electronic circuit board in which the electronic components have been soldered to the board can be produced.

According to the second embodiment, the temperature difference in the solder material within the respective connecting portions which are being solidified and also the temperature difference in the solder material over the whole board which is being solidified (i.e. the overall temperature difference of the solder material) are diminished (or narrowed), so that, as a result, the variation of the initial temperature of the solder material upon the start of the rapid cooling as well as the variation of the period required for the complete solidification of the solder material can be made smaller. Thereafter, an occurrence of the lift-off phenomenon is further suppressed.

EXAMPLES

In the flow soldering process, an influence of the cooling rate of the solder material upon the occurrence of the lift-off phenomenon was examined. Electronic circuit boards were produced under various conditions of the flow soldering process while using the flow soldering apparatus as explained above with reference to the first or second embodiment.

The various conditions for which electric circuit boards were produced are listed in Table 1 below. Referring to Table 1, Examples 1 and 2, which used the cooling zone without a conditioning zone, correspond to the flow soldering process and apparatus of the first embodiment. On the other hand, Examples 3 to 8, which used both the cooling zone and the conditioning zone (i.e. the cooling chamber and the conditioning chamber), correspond to the flow soldering process and apparatus of the second embodiment. In all of the Examples, an Sn-Ag-Bi based material (melting point (m.p.) of about 215° C.) was used as the lead-free solder material.

TABLE 1

| Example No. | Conditions | | cooling zone** atmosphere |
|---|---|---|---|
| | conditioning zone | | |
| | atmosphere | temp. | |
| 1* | — | — | air |
| 2* | — | — | N$_2$ gas |
| 3 | air | 150° C. | air |
| 4 | N$_2$ gas | 150° C. | N$_2$ gas |
| 5 | air | 220° C. | air |
| 6 | N$_2$ gas | 220° C. | N$_2$ gas |
| 7 | air | 240° C. | air |
| 8 | N$_2$ gas | 240° C. | N$_2$ gas |

*Without conditioning zone
**Cooling rates of 50, 100, 200, 300, 400 and 500° C./min. were employed in each Example.

Electronic circuit boards were produced by conducting the flow soldering process while blowing a gas having a predetermined temperature with a predetermined flow rate so as to achieve the cooling rates of the solder material of 50, 100, 200, 300, 400 and 500° C./min. in Examples 1 to 8, respectively, and the occurrence ratios of the lift-off phenomenon upon the production of the electronic circuit boards were obtained. The results are shown in Table 2.

TABLE 2

| Example No. | Occurrence Ratio of Lift-off Phenomenon (%) | | | | | |
|---|---|---|---|---|---|---|
| | cooling rate (° C./min.) | | | | | |
| | 50 | 100 | 200 | 300 | 400 | 500 |
| 1 | 50 | 30 | 15 | 10 | 8 | 5 |
| 2 | 35 | 18 | 8 | 5 | 3 | 1 |
| 3 | 43 | 24 | 9 | 7 | 5 | 3 |
| 4 | 34 | 18 | 7 | 5 | 3 | 1 |
| 5 | 42 | 23 | 8 | 6 | 4 | 2 |
| 6 | 32 | 16 | 6 | 4 | 2 | 1 |
| 7 | 41 | 22 | 8 | 5 | 4 | 1 |
| 8 | 30 | 15 | 5 | 3 | 1 | 0 |

As seen from Table 2, the occurrence ratio of the lift-off phenomenon was small as the cooling rate increased as to all the conditions. It was confirmed that the occurrence ratio of the lift-off phenomenon is effectively reduced upon rapidly cooling the solder material as in the flow soldering process of the present invention, and especially in the case where the cooling rate of the solder material is not less than 200° C./min. For example, even in Example 1 which used the cooling zone alone without a conditioning zone, the occurrence ratio of the lift-off phenomenon was reduced to or was below 15% by using a cooling rate of the solder material to about 200° C./min. or above.

Further, referring to Table 2 and comparing the occurrence ratio of Example 1 using the cooling zone alone with those of Examples 3, 5 and 7 using both the cooling zone and the conditioning zone (of which temperatures in the conditioning zone are 150, 220 and 240° C., respectively), it can be understood that the occurrence ratios of Examples 3, 5 and 7 were smaller than that of Example 1, where all of the Examples were conducted by the flow soldering process using air as the cooling gas. It could be expected that in Example 3, in which the atmosphere temperature of the conditioning zone is lower than the melting point of the used solder material (about 215° C.) as used in Examples 3, 5 and 7, the solder material adhering to the board did not start to solidify and thus was kept substantially in the molten condition before leaving the conditioning zone. I should be noted that when the temperature of the atmosphere of the conditioning zone is lower than the melting point of the solder material, whether the solder material which is adhering to the board is kept in the molten condition or not depends on for example the temperature of the solder material which is to be supplied to the board, a speed at which the board is transferred, a length of the conditioning zone and so on, and accordingly, the atmosphere temperature of 150° C. of the conditioning zone cannot always keep the solder material in the molten condition. Additionally, when comparing the results of Examples 3, 5 and 7, the occurrence ratio of the lift-off phenomenon was smaller as the temperature of the conditioning zone atmosphere increased. Especially in the case of Examples 5 and 7 in which the temperatures of the conditioning zone were higher than the melting point of the Sn-Ag-Bi based material as the lead-free solder material (i.e. 215° C.), the occurrence ratio of the lift-off phenomenon was reduced to or was below 8% when the cooling rate of the solder material was about 200° C./min. or more. This result could occur because passing through the conditioning zone, whose atmosphere temperature is not less than the melting point of the solder material, ensures that the solder material is kept in the molten condition.

Furthermore, it can be understood that the occurrence ratios of Examples 2, 4, 6 and 8 were smaller than those of Examples 1, 3, 5 and 7, respectively, when the conditions of Examples 2, 4, 6 and 8 were substantially the same as those of Examples 1, 3, 5 and 7, respectively, except that the atmosphere in which the flow soldering was carried out differently (i.e. air vs. nitrogen). In other words, the occurrence ratio of the lift-off phenomenon can be further reduced by conducting the flow soldering process by using the nitrogen gas atmosphere as opposed to conducting the flow soldering process by the air as the cooling gas.

According to the present invention, there is provided the process of flow soldering in which lead-free solder material is used and through which process the occurrence of the lift-off is effectively suppressed. Also, there is provided the apparatus for conducting such a process.

What is claimed is:

1. A flow soldering process for mounting an electronic component onto a board by means of a lead-free solder material, which process comprises:

supplying a melt of the solder material such that the solder material adheres to a predetermined portion of the board in a solder material supplying zone;

conditioning the board in a conditioning zone at a temperature in a range from a melting point of the solder material to a heat resistant temperature of the electronic component so as to ensure that the solder material adhering to the board is in a completely molten condition; and then cooling the board by a cooling unit in a cooling zone such that the solder material adhering to the board is rapidly cooled to solidify.

2. The process according to claim 1, wherein the solder material is cooled by the cooling unit at a cooling rate which is not less than 200° C./min.

3. The process according to claim 1, wherein the cooling unit is a unit which uses gas cooling or liquid cooling.

4. The process according to claim 3, wherein the cooling unit is a unit which uses the gas cooling with nitrogen gas.

5. The process according to claim 1, wherein the conditioning zone has a nitrogen gas atmosphere.

6. The process according to claim 1, wherein occurrence of a segregation phenomenon in the solder material is suppressed by the rapid cooling of the solder material.

7. The process according to claim 1, wherein a fine structure of a metal phase is formed by the rapid cooling of the solder material.

* * * * *

UNITED STATES PATENT AND TRADEMARK OFFICE
CERTIFICATE OF CORRECTION

PATENT NO.     : 6,648,216 B2
DATED          : November 18, 2003
INVENTOR(S)    : Atsushi Yamaguchi et al.

It is certified that error appears in the above-identified patent and that said Letters Patent is hereby corrected as shown below:

Column 4,
Line 59, delete "." after "C".
Line 61, delete "." after "to 500º C", and delete "." after "300 to 500º C".

Column 5,
Lines 35 and 48, delete "." after "º C".

Column 6,
Lines 22 and 27, delete "." after "º C".

Column 7,
Line 57, delete "." after "º C".

Column 8,
Line 36, delete "." after "C".

Column 11,
Line 51, delete "." after "º C".

Column 12,
Lines 16 and 37, delete "." after "º C".
Line 38, delete "." after "200 to 500º C", and delete "." after "300 to 500º C".

Column 13,
Line 37, delete "." after "º C".

Column 14,
Line 16, delete "." after "º C".
Table 1, in the third row of the "temp." delete "." after "150º C".
Table 1, in the fourth row of the "temp." delete "." after "150º C".
Table 1, in the fifth row of the "temp." delete "." after "220º C".
Table 1, in the sixth row of the "temp." delete "." after "220º C".
Table 1, in the seventh row of the "temp." delete "." after "240º C".
Table 1, in the eighth row of the "temp." delete "." after "240º C".
Below Table 1 and before line 35, delete "." after "º C".
Line 39, delete "." after "º C".
Line 66, delete "." after "C".

UNITED STATES PATENT AND TRADEMARK OFFICE
CERTIFICATE OF CORRECTION

PATENT NO. : 6,648,216 B2
DATED : November 18, 2003
INVENTOR(S) : Atsushi Yamaguchi et al.

It is certified that error appears in the above-identified patent and that said Letters Patent is hereby corrected as shown below:

<u>Column 15,</u>
Lines 3, 8, 15, 27 and 35, delete "." after "º C".
Line 38, delete "." after "C".

<u>Column 16,</u>
Line 32, delete "." after "º C".

Signed and Sealed this

Sixth Day of April, 2004

JON W. DUDAS
*Acting Director of the United States Patent and Trademark Office*